United States Patent [19]

Imai et al.

[11] Patent Number: 5,140,623
[45] Date of Patent: Aug. 18, 1992

[54] INPUT BIAS CIRCUIT FOR GATE INPUT TYPE CHARGE TRANSFER DEVICE FOR CONTROLLING THE POTENTIAL LEVEL OF THE INPUT SIGNAL

[75] Inventors: Shin-ichi Imai; Atsuhiko Nunokawa, both of Yokohama, Japan

[73] Assignee: Kabushiki Kaisha Toshiba, Kawasaki, Japan

[21] Appl. No.: 713,086

[22] Filed: Jun. 11, 1991

[30] Foreign Application Priority Data

Jun. 12, 1990 [JP] Japan .................. 2-153597

[51] Int. Cl.$^5$ .................. G11C 19/28; G11C 27/04; H01L 29/78
[52] U.S. Cl. .................. 377/60; 377/59; 377/63; 357/24; 307/296.6; 307/607
[58] Field of Search .................. 377/57–63; 357/24; 307/296.1, 296.6, 607, 279, 497, 540, 562, 362; 358/213.23; 330/253

[56] References Cited

U.S. PATENT DOCUMENTS

| | | | |
|---|---|---|---|
| 3,999,171 | 12/1976 | Parsons | 377/58 |
| 4,139,784 | 2/1979 | Sauer | 377/57 |
| 4,156,818 | 5/1979 | Collins | 377/60 |
| 4,503,550 | 3/1985 | Sauer | 377/63 |
| 4,574,384 | 3/1986 | Murata et al. | 377/58 |
| 4,621,369 | 11/1986 | Narabu et al. | 377/60 |

FOREIGN PATENT DOCUMENTS 0393996 10/1990 European Pat. Off. .......... 377/63

OTHER PUBLICATIONS

Carlo H. Sequin and Michael F. Tompsett, Charge Transfer Devices, Bell Telephone Laboratories, Inc., 1975—pp. 42–45.

Primary Examiner—Stanley D. Miller
Assistant Examiner—Tai V. Duong
Attorney, Agent, or Firm—Finnegan, Henderson, Farabow, Garrett and Dunner

[57] ABSTRACT

An input bias circuit employs a gate input type CCD register and an inversion-type amplifier. An output node of the inversion-type amplifier is connected to the input gate electrode of the CCD register, and an input signal to be biased is supplied to the input gate electrode. An output node of the inversion-type amplifier is connected to the floating diffusion region of the CCD register, and a signal charge is picked up from the floating diffusion region. A comparator performs comparison among the low level of the injection pulse supplied to the input diffusion region (which serves as an input diode), the potential level of the input signal supplied to the input gate electrode of the CCD register, and the level of the low-level generated by a low-level signal generating means. On the basis of this comparison, the potential level of the input signal of the CCD register is controlled such that it is higher than the low level of the injection pulse.

14 Claims, 5 Drawing Sheets

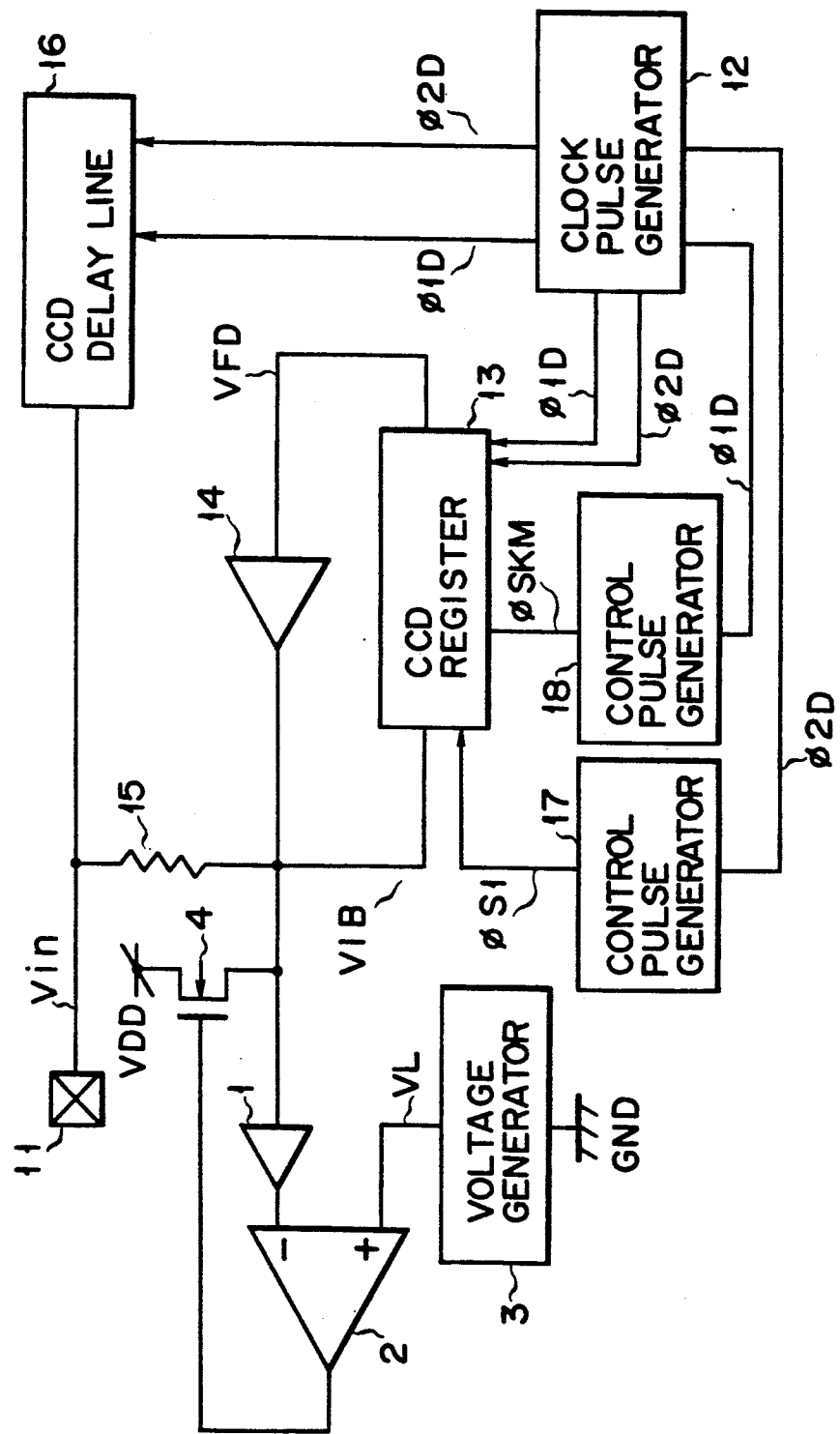
F I G. 1

INPUT BIAS CIRCUIT FOR GATE INPUT TYPE CHARGE TRANSFER DEVICE FOR CONTROLLING THE POTENTIAL LEVEL OF THE INPUT SIGNAL

BACKGROUND OF THE INVENTION

1. Field of the Invention

The present invention relates to an input bias circuit for a charge transfer device (CTD) and is employed in the input section of a delay line, a comb filter, a transversal filter, or the like.

2. Description of the Related Art

An input bias circuit which is made up of a gate input type (i.e., fill & spill type) charge coupled device (CCD) register and an inversion type amplifier has been well known in the art as a circuit for bias-controlling the input charge of a charge transfer device (CTD). The fill & spill type CCD register is described, for example, in Carlo H. Sequin and Michael F. Tompsett, *Charge Transfer Devices*, Bell Telephone Laboratories, Inc., 1975.

The conventional input bias circuit made up of both the CCD register and the inversion type amplifier has the circuit configuration below.

The CCD register of the input bias circuit is comprised of: an input diode constituted by a diffusion region formed in the substrate; an input gate electrode which is formed on the substrate, with an insulating film interposed, and which is located adjacent to the input diode; a plurality of transfer gate electrodes which are formed on the substrate, with an insulating film interposed, and which are located adjacent to the input gate electrode; a floating diffusion region which is formed on those portions of the substrate surface which are between the transfer gate electrodes and which is used for picking up a transfer charge; and an output diode constituted by a diffusion region which is formed in the substrate and located near the end of arrangement of transfer gate electrodes.

The output terminal of the inversion-type amplifier is connected to the input gate electrode of the CCD register, and the input terminal thereof is connected to the floating diffusion region of the CCD register. An input signal is supplied to the input gate electrode of the CCD register by way of a level-sifting resistor. At the time, a potential well determined in accordance with the input signal is generated in that portion of the substrate which is located under the input gate electrode, and the charge injected from the input diode flows into the potential well. Upon application of a transfer pulse to the transfer gate electrode, the potential well moves to the substrate surface portion which is located under the transfer gate electrode, thus transferring the charge. In the floating diffusion region, charge inflow and charge outflow occur alternately. The difference between the output charge SO picked up in the floating diffusion region and the input charge QI injected from the input diode is integrated in accordance with capacitance CFD, thereby determining voltage VFD to be applied to the inversion-type amplifier. In response to the application of voltage VFD, inversion-type amplifier outputs voltage VIB, which is used for biasing the input signal supplied through the level-shifting resistor. Voltage VFD is determined by the following formula:

$$VFD = \frac{\int (QO - QI)dt}{CFD} \quad (1)$$

As is understood from this formula, if QO>QI, voltage VFD is high. In this case, the inversion-type amplifier lowers voltage VIB, so that the input charge QI increases. On the other hand, if QO<QI, voltage VFD is low. In this case, the inversion-type amplifier raises voltage VIB, so that the input charge QI decreases. Therefore, the condition for producing a stable state is represented by QI=QO, and when this relationship is satisfied, voltage VIB is stable.

A signal charge biased by the bias circuit mentioned above is transferred through a CCD delay line. Let it be assumed that the maximum transferable charge amount of the CCD delay line is denoted by Qa and that the channel width of that CCD delay line is denoted by Wa. If the CCD delay line and the input section of the CCD register are the same in shape and if the charge amount which can be input is sufficiently larger than the maximum transferable charge amount Qa, the maximum transferable charge amount changes in proportion to the channel width Wa. Further, since the output charge QO of the CCD register corresponds to the maximum transferable charge amount of the charge-expelling channel located behind the floating diffusion region, it changes in proportion to the width WO of the charge-expelling channel. Therefore, the following formula is obtained:

$$Qa:QO=Wa:WO \quad (2)$$

As may be understood from this formula, the charge accounting for a certain percentage of the maximum transferable charge amount of the CCD delay line can be supplied to the CCD register by properly determining the channel width WO. The voltage VIB applied when that charge is injected into the CCD register is the same as the voltage applied when the CCD delay line receives a certain percentage of charge, and with the voltage VIB being used as an input bias of the CCD delay line, the bias voltage can be determined at a level corresponding to an arbitrary percent of the maximum transferable charge amount. Even if the CCD does not have such characteristic as intended at the time of design, optimal biasing is always achieved since the bias voltage is determined at the level noted above.

The input bias circuit described above has such a problem to be discussed below.

In a system incorporating the above input bias circuit, it may happen that voltage VIB will lower when the system is turned on or in some other situation. At such a time, the potential applied to the input gate electrode will lower. If this potential becomes lower than the low-level (L-level) potential applied to the input diode, no charge is injected into the CCD register. In the input bias circuit, therefore, the potential applied to the input gate electrode is maintained within the range between the high-level (H-level) and the low-level (L-level) of the potential applied to the input diode, so as to control the injection of the input charge QI. However, if the well whose potential is applied to the input gate electrode is shallower than the well whose potential is applied to the input diode, then it becomes impossible to inject charge. Since, therefore, no charge is transferred to the floating diffusion region, voltage VFD rises. If voltage VFD rises, voltage VIB (i.e., the output of the inversion-type amplifier) further lowers, and the potential at the input gate electrode to which voltage VIB is applied is undesirably maintained at a lower level than that of the L-level potential applied to the input diode, with the result that an input bias voltage is not generated.

To solve the problem mentioned above, it is thought to add a potential level-controlling function to a control pulse generator which generates pulses for controlling the injection, transfer and output of charge. In other words, voltage VIB is detected, and control is performed such that the L-level potential applied to the input diode is constantly maintained at a level lower than that of the potential applied to the input gate electrode. However, the control pulse generator having such a function cannot be operated at high speed when it is operated on a low power source voltage, and is not suitable for use with a CCD register which requires high-speed operation when operated on a low voltage.

As mentioned above, the conventional input bias circuit does not permit charge to be injected into the CCD register if voltage VIB becomes low when the power source is turned on or in some other situation. In the worst case, the conventional input bias circuit cannot generate an input bias voltage. Even if the control pulse generator of the input bias circuit is designed to have a potential level-controlling function, the input bias circuit is not suitable for use with a CCD register which requires a high-speed operation at the time of application of a low voltage.

SUMMARY OF THE INVENTION

Accordingly, an object of the present invention is to provide an input bias circuit for a charge transfer device, which employs a gate electrode input type CCD register capable of generating an optimal input bias voltage at all times.

To achieve this object, the present invention provides an input bias circuit for a charge transfer device, comprising:

a gate input type CCD register to which a signal charge is transmitted at the timing of a clock pulse;

an inversion-type amplifier having an output node and an input node, the output node being connected to an input gate electrode which is incorporated in the CCD register and which is supplied with an input signal to be biased, the input node being connected to a floating diffusion region which is incorporated in the CCD register and from which the signal charge is picked up;

injection pulse-generating means for generating, in synchronism with the clock pulse, an injection pulse to be applied to an input diffusion region which is incorporated in the CCD register and which serves as an input diode; low-level signal generating means for generating a signal corresponding to a low level of the injection pulse generated by the injection pulse-generating means; and potential level control means for comparing the potential level of the input signal supplied to the input gate electrode of the CCD register with the level of the low-level signal generated by the low-level signal generating means, and for performing control such that the potential level of the input signal of the CCD register is higher than the low-level of the injection pulse at all times.

According to the present invention, potential level control means can be obtained, without complicating the circuit which generates a transfer pulse needed for the transfer of a signal charge.

Additional objects and advantages of the invention will be set forth in the description which follows, and in part will be obvious from the description, or may be learned by practice of the invention. The objects and advantages of the invention may be realized and obtained by means of the instrumentalities and combination particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing the circuit of the first embodiment of the present invention;

DETAILED DESCRIPTION OF THE PREFERRED EMBODIMENTS

Figure 2:
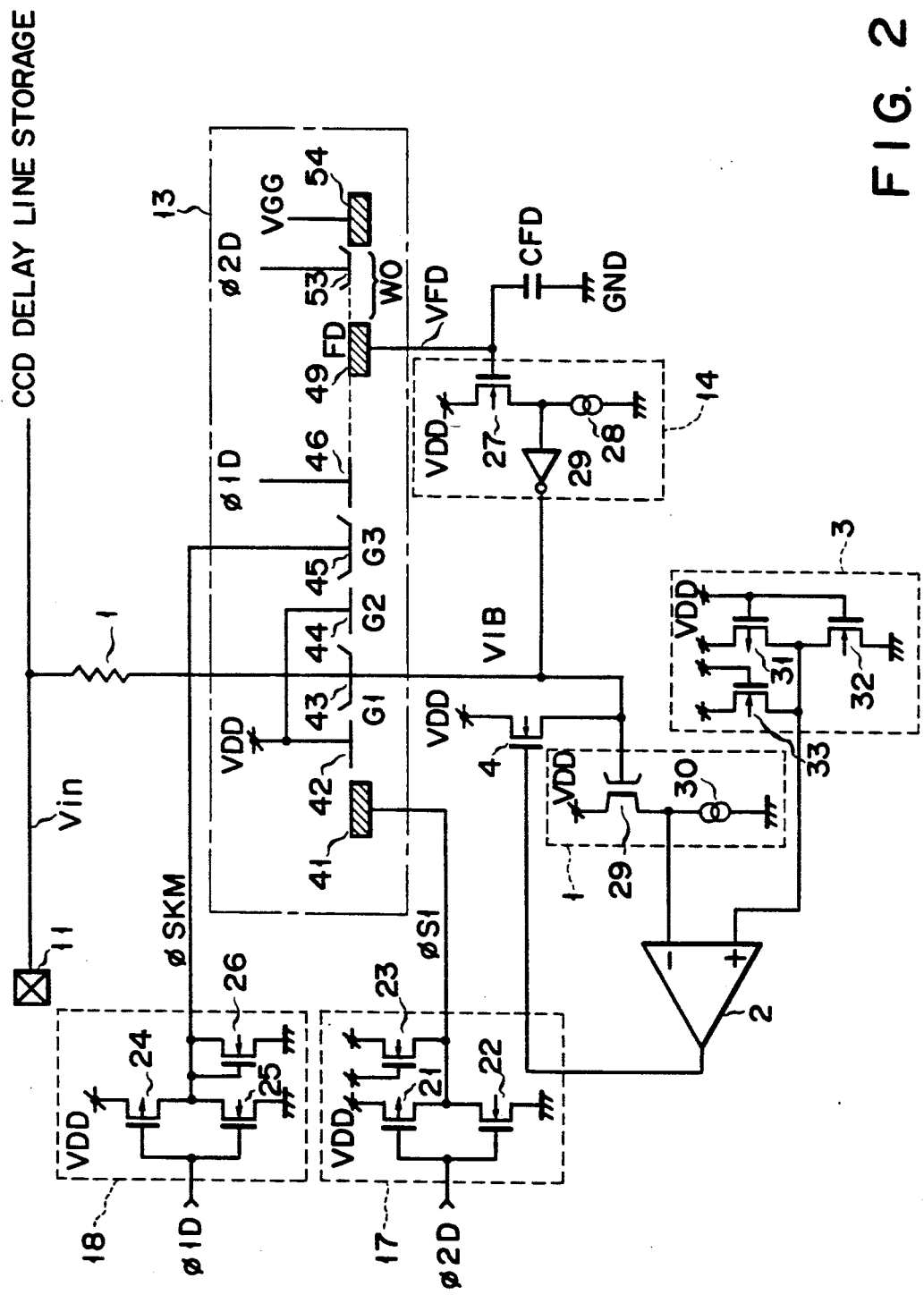
FIG. 2 is a detailed diagram of the circuit shown in FIG. 1.

Embodiments of the present invention will now be described, with reference to the accompanying drawings.

FIG. 1 is a circuit diagram of the input bias circuit for a charge transfer device, the input bias circuit being obtained according to the first embodiment of the present invention.

Referring to FIG. 1, an input signal Vin, supplied through an input terminal 11, is biased by a CCD register 13 and an inversion-type amplifier 14, both controlled by a clock pulse generator 12. The output terminal of the inversion-type amplifier 14 is connected to an input gate electrode (not shown) which incorporated in the CCD register 13, while the input terminal of the inversion-type amplifier is connected to a floating diffusion region (not shown) which is also incorporated in the CCD register and from which a transfer charge is picked up. The signal line through which the input signal Vin is connected to the subject input bias circuit through a level-shifting resistor 15. After being biased, the input signal Vin is supplied to a CCD delay line 16, by which charge is transferred under the control of the clock pulse generator 12. Control pulse generator 17 receives a clock pulse $\phi 2D$ from the clock pulse generator 12, and supplies an injection pulse $\phi S1$ to the CCD register 13; likewise, control pulse generator 18 receives a clock pulse $\phi 1D$ from the clock pulse generator 12, and supplies a control pulse $\phi SKM$ to the CCD register 13. Voltage VIB determined by both the CCD register 13 and the inversion-type amplifier 14 is supplied to a potential converter 1. The potential converter 1 converts voltage VIB into a substantial potential which is applied to the input gate electrode of the CCD register 13, and the substantial potential is output from the potential converter 1. The potential output from the potential converter 1 is supplied to the inverted input terminal of a comparator 2. The noninverted input terminal of the comparator 2 is connected to the output terminal of a voltage generator 3. The voltage generator 3 outputs voltage VL whose level corresponds to the L-level (low-level) of the injection pulse φS1 supplied to the input diode of the CCD register 13. The output terminal of the comparator 2 is connected to the gate electrode of an N-channel MOSFET 4. The drain of the MOSFET 4 is connected to a power source and is applied with voltage VDD which is high enough to drive the MOSFET 4. The source of the MOSFET 4 is connected to a node where voltage VIB appears.

In the above circuit configuration, the comparator 2 compares the potential of voltage VIB and the potential corresponding to the L-level of the injection pulse φS1. An output of the comparator 2 is inverted only when the potential of voltage VIB becomes lower than that of the L-level of the injection pulse φS1. When the output of the comparator 2 is inverted, the MOSFET 4 is turned on, s that voltage VIB rises and the potential thereof increases. When the potential of voltage VIB becomes higher than the potential corresponding to the L-level of the injection pulse φS1, the output of the comparator 2 is inverted again, thus turning off the MOSFET 4.

FIG. 2 is a detailed diagram of the circuit shown in FIG. 1. Referring to FIG. 2, control pulse generators 17 and 18, which are controlled by the lock pulse generator 12, contain MOSFETs 21-23 and MOSFETs 24-26, respectively, and are of the CMOS inverter configuration. Control pulse generator 17 receives a clock pulse φ2D generated by the clock pulse generator 12, and outputs an injection pulse φS1; likewise, control pulse generator 18 receives a clock pulses φ1D generated by the clock pulse generator 12, and outputs a control pulse φSKM. The injection pulse φS1 is supplied to a diffusion region 41, which serves as the input diode of the CCD register 13, while the control pulse φSKM is supplied to a third transfer gate electrode 45.

The input node of the inversion-type amplifier 14 is made by the gate electrode of an N-channel MOSFET 27. A floating diffusion (FD) region 49 incorporated in the CCD register 13 is connected to the gate electrode of the MOSFET 27. The inversion-type amplifier 14 contains an N-channel MOSFET 27, a constant current source 28 and an inverter 29, and the potential appearing at the node between the MOSFET 27 and the constant current source 28 is output by way of the inverter 29 as voltage VIB. This voltage VIB is supplied to a first transfer gate electrode 43 of the CCD register 13, and is also supplied to the potential converter 1. In the potential converter 1, a depletion N-channel MOSFET 29 has the same gate electrode as the first gate electrode 43 is formed. Voltage VI is applied to the gate electrode of the MOSFET 29, and due to a constant current source 30 connected to the drain of the MOSFET, a drain output of the MOSFET 29 is controlled such that it is equal to the potential which appears at the substrate portion located below the first transfer gate electrode 43.

The voltage generator 3, which outputs voltage VL whose level corresponds to the L-level (low-level) of the injection pulse φS1, includes MOSFETs 31, 32 and 33. The voltage generator 3 has the same circuit configuration as that of control pulse generator 17, but instead of clock pulse φ2D, the input terminal of the voltage generator 3 is applied with a constant-level voltage, e.g voltage VDD. Due to the application of this voltage, the voltage VL generated by the voltage generator 3 corresponds to the L-level of the injection pulse φS1.

An output of the potential converter 1 and an output of the voltage generator 3 are supplied to the inverted and non-inverted input terminals of the comparator 2, respectively. An output of the comparator 2 is fed back through the MOSFET 4.

Figures 3, 4A, 4B:
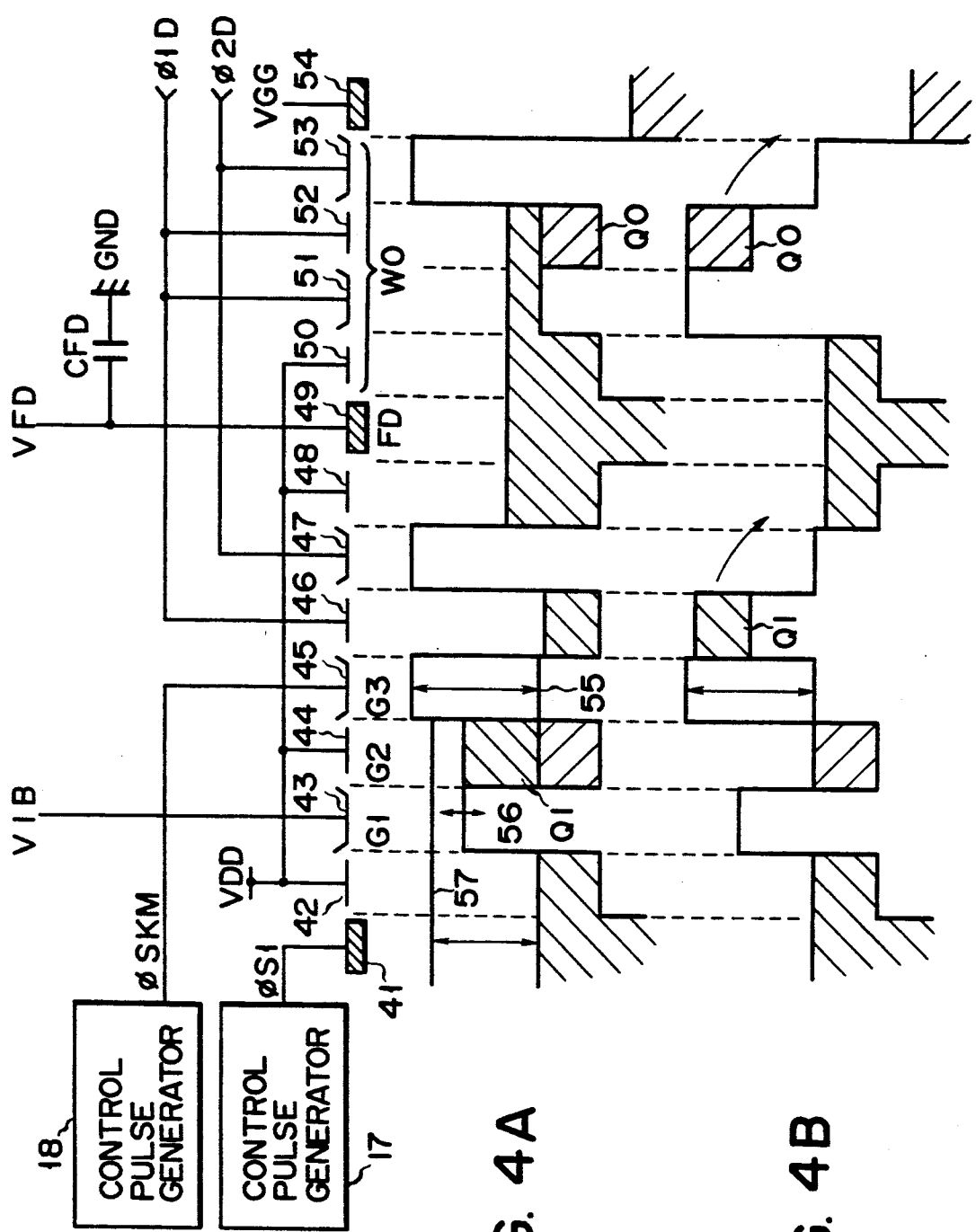
FIG. 3 is a circuit diagram showing an example of a CCD register.
FIGS. 4A and 4B are potential diagrams illustrating the operation of the circuit shown in FIG. 3.
Figure 5:
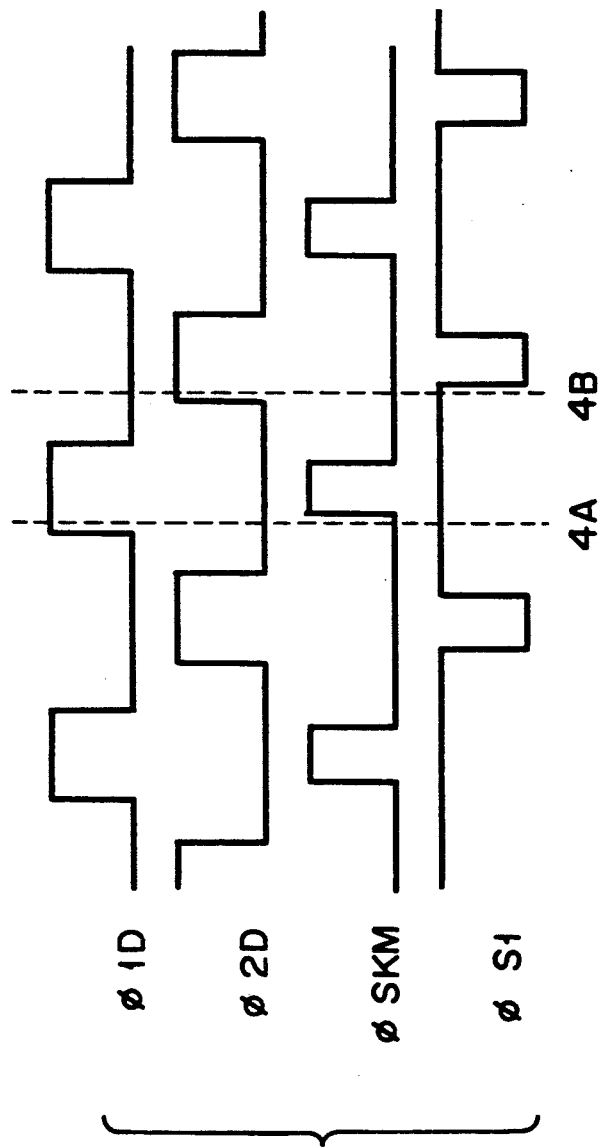
FIG. 5 is a timing chart of the pulses supplied to the circuit shown in FIG. 3.

FIG. 3 is a diagram showing an example of a circuit configuration of the CCD register 13, and FIGS. 4A and 4B are potential diagrams illustrating the operation of the circuit of the CCD register 13 shown in FIG. 3. FIG. 5 is a timing chart of the pulses supplied to the CCD register 13, and the pulse states at times 4A and 4B indicated in FIG. 5 correspond to the potential diagrams shown in FIGS. 4A and 4B, respectively.

In the state shown in FIG. 4A, charge QI, the amount of which is determined by the difference between potential 55 (i.e., the H-level potential at the third transfer gate electrode 45) and potential 56 (i.e., the potential which appears at the first gate electrode 43 at the time of application of voltage VIB), is injected into the CCD register 13. Therefore, the amount of charge QI is can be varied in accordance with the level of voltage VIB. This charge-injection method is generally referred to as a gate electrode input method or as a fill & spill method. In the state shown in FIG. 4A, charge QO is picked up from the floating diffusion (FD) region 49.

In the state shown in FIG. 4B, charge QI is injected into the floating diffusion (FD) region 49, and charge QO is expelled into a diffusion region 54 which is applied with boosted voltage VGG and which serves as an output diode. As is understood from this, the inflow of charge QI and the outflow of charge QO alternately occur in the floating diffusion (FD) region 49, and the difference between charge QO and charge QI is integrated in accordance with capacitance CFD, so that voltage VFD is determined in the manner expressed by formula (1) noted above.

As described above, charge is input to the CCD register 13 in accordance with pulses φS1, φSKM, φ1D and φ2D supplied to that CCD register 13, and voltage VFD detected in the floating diffusion (FD) region 49 is fed back to the first transfer gate electrode 43 through the inversion-type amplifier 14. In this manner, a control loop operation is performed for stabilizing voltage VIB. During the control loop operation, the comparator 2 constantly compares the potential of voltage VIB applied to the inverted input terminal thereof (i.e., potential 56 shown in FIG. 4A) and the L-level potential of the injection pulse φS1 applied to the non-inverted input terminal thereof (i.e., potential 57 indicated in FIG. 4A). Whenever charge is injected into the CCD register 13, the L-level potential of the injection pulse φS1 never fails to be lower than the potential of voltage VIB, so that the output of the comparator is in the L-level and the MOSFET 4 is in the OFF state. Since, therefore, voltage VIB does not much vary, the input signal Vin can be biased in a reliable manner.

When the system is turned on or if external surge occurs, it may happen that voltage VIB will drop temporarily. If the potential of voltage VIB becomes lower than the L-level potential of the injection pulse φS1, the output of the comparator 2 is inverted from the L-level to the H-level. Accordingly, the MOSFET 4 is turned on, thus raising voltage VIB. When the potential of voltage VIB exceeds the L-level potential of the injection pulse φS1, the output of the comparator 2 is inverted again. As a result, the output of the comparator 2 is inverted to the L-level. Thus, the MOSFET 4 is turned off, and the CCD register 13 and the inversion-type amplifier resume a normal control loop operation.

In the manner described above, the potential of voltage VIB can be controlled such that it is higher than the L-level potential of the injection pulse φS1 at all times. Further, control pulse generators 17 and 18 are simple in circuit configuration since they need not be provided with a potential level-controlling function. Therefore, the CCD register 13 can operate at a high speed on a low voltage.

Figure 6:
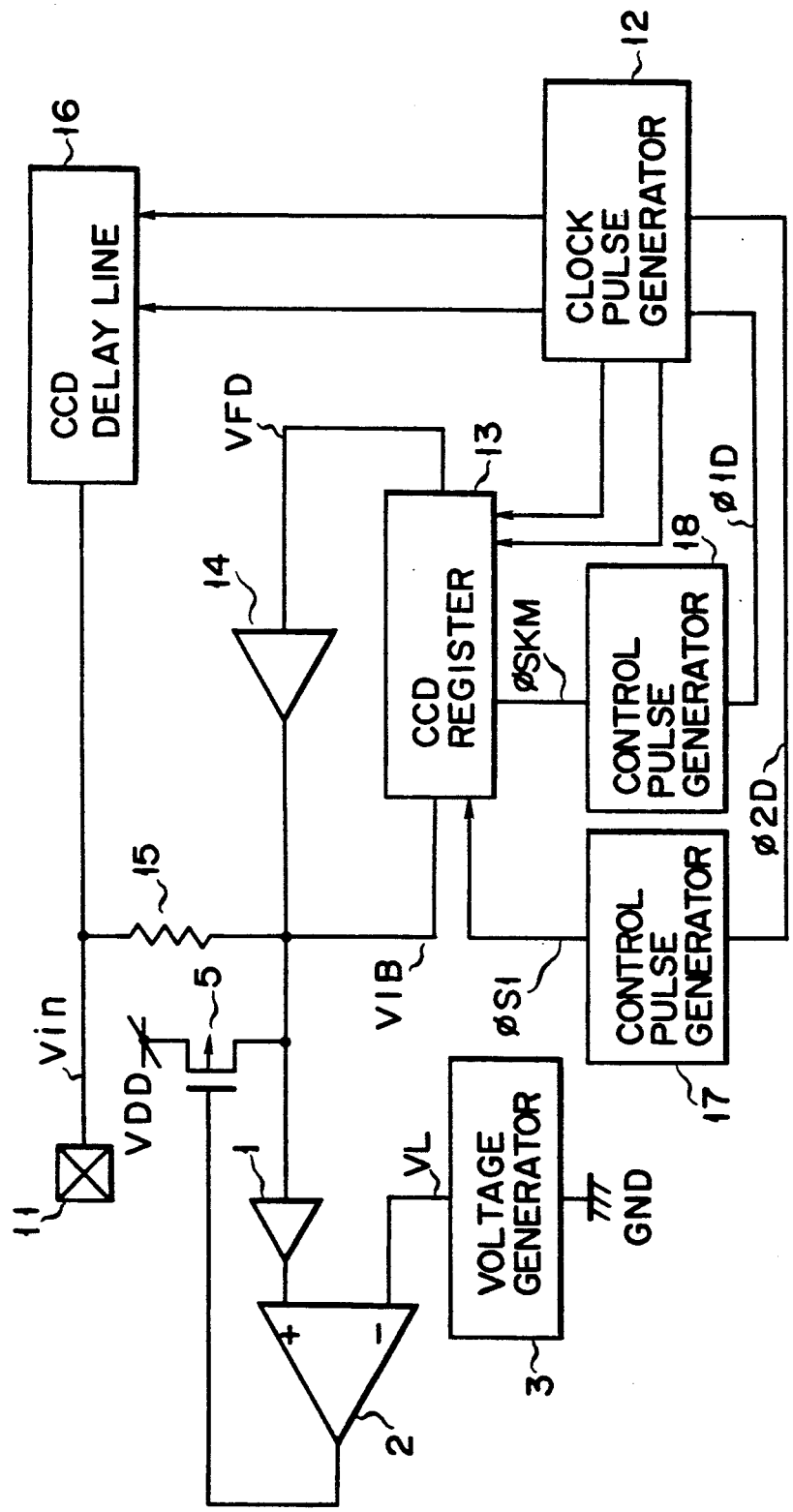
FIG. 6 is a diagram showing the circuit of the second embodiment of the present invention.

FIG. 6 shows another embodiment of the present invention. As is shown in FIG. 6, an output of a potential converter 1 is supplied to the non-inverted input terminal of a comparator 2, and an output of a voltage generator 3 is supplied to the inverted input terminal of the comparator 2. In the embodiment shown in FIG. 6, a P-channel MOSFET 5 is employed in place of the N-channel MOSFET 4 shown in FIG. 1. With this circuit arrangement, it is possible to achieve a similar operation to that of the circuit shown in FIG. 1.

As has been described, the present invention employs a CCD register of the gate input type (i.e., a fill & spill type). Even if the bias voltage decreases due to the actuation of the system or the occurrence of external surge, the bias voltage is controlled in accordance with the output of the comparator so as to achieve a normal operation loop. Accordingly, it is possible to provide an input bias circuit for a charge transfer device, which ensures application of an optimal input bias voltage at all times and which achieves a high-speed operation on a low voltage.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An input bias circuit for a charge transfer device, comprising:
   a gate input type CCD register to which a signal charge is transmitted at the timing of a clock pulse;
   an inversion-type amplifier having an output node and an input node, said output node being connected to an input gate electrode which is incorporated in the CCD register and which is supplied with an input signal to be biased, said input node being connected to a floating diffusion region which is incorporated in the CCD register and from which the signal charge is picked up;
   injection pulse-generating means for generating, in synchronism with the clock pulse, an injection pulse to be applied to an input diffusion region which is incorporated in the CCD register and which serves as an input diode;
   low-level signal generating means for generating a signal corresponding to a low level of the injection pulse generated by the injection pulse-generating means; and
   potential level control means for comparing the potential level of the input signal supplied to the input gate electrode of the CCD register with the level of the low-level signal generated by the low-level signal generating means, and for performing control such that the potential level of the input signal of the CCD register is higher than the low level of the injection pulse at all times.

2. An input bias circuit according to claim 1, wherein said low-level signal generating means and said injection pulse-generating means are similar in circuit configuration.

3. An input bias circuit according to claim 2, wherein pulse generation timing of said injection pulse-generating means is controlled by utilization of the clock pulse.

4. An input bias circuit according to claim 2, wherein said low-level signal generating means generates the signal corresponding to the low level of the injection pulse by utilizing a constant-level voltage.

5. An input bias circuit according to claim 1, wherein said potential level control means includes a potential converter circuit for performing conversion in accordance with the voltage of the input signal supplied to the CCD register so as to obtain a potential level which is equivalent to a potential profile relating to the inside of the CCD register, said potential level obtained by the potential converter circuit being compared with the low-level of the signal generated by the low-level signal generating means.

6. An input bias circuit according to claim 1, wherein said potential level control means includes:
   a potential converter circuit for performing conversion in accordance with the voltage of the input signal supplied to the CCD register so as to obtain a potential level which is equivalent to a potential profile relating to the inside of the CCD register;
   a comparator for comparing the potential level obtained by the potential converter circuit with the low-level of the signal generated by the low-level signal generating means; and
   a switching element which is controlled in accordance with an output of the comparator,
   the voltage of the input signal supplied to the CCD register being raised when the switching element is turned on.

7. An input bias circuit according to claim 6, wherein said switching element includes a MOSFET having a gate electrode to which an output of the comparator is supplied, said MOSFET having a current path with first and second ends, said first end of the current path being connected to a point where a voltage sufficiently higher than the voltage of the input signal supplied to the CCD register is applied, and said second end of the current path being connected to that input gate electrode of the CCD register which is supplied with the input signal.

8. An input bias circuit according to claim 7, wherein:
   said MOSFET is an N-channel MOSFET; and
   said comparator has an inverted input terminal for receiving the potential level obtained by the potential converter circuit, and a non-inverted input terminal for receiving the low-level signal generated by the low-level signal generating means.

9. An input bias circuit according to claim 7, wherein:
   said MOSFET is a P-channel MOSFET; and
   said comparator has a non-inverted input terminal for receiving the potential level obtained by the potential converter circuit, and an inverted input terminal for receiving the low-level signal generated by the low-level signal generating means.

10. An input bias circuit for a charge transfer device, comprising:
    a gate input type CCD register to which a signal charge is transmitted at the timing of a clock pulse;

an inversion-type amplifier having an output node and an input node, said output node being connected to an input gate electrode which is incorporated in the CCD register and which is supplied with an input signal to be biased, said input node being connected to a floating diffusion region which is incorporated in the $\phi$CD register and from which the signal charge is picked up;

injection pulse-generating means for generating, in synchronism with the clock pulse, an injection pulse to be applied to an input diffusion region which is incorporated in the CCD register and which serves as an input diode;

low-level signal generating means for generating a signal corresponding to a low level of the injection pulse generated by the injection pulse-generating means;

a potential converter circuit for performing conversion in accordance with the voltage of the input signal supplied to the CCD register so as to obtain a potential level which is equivalent to a potential profile relating to the inside of the CCD register;

a comparator for comparing the potential level obtained by the potential converter circuit with the low-level of the signal generated by the low-level signal generating means; and a switching element which is controlled in accordance with an output of the comparator such that the potential level of the input signal supplied to the CCD register is higher than the low level of the injection pulse at all times.

11. An input bias circuit according to claim 10, wherein:

said low-level signal generating means and said injection pulse-generating means are similar in circuit configuration;

pulse generation timing of said injection pulse-generating means is controlled by utilization of the clock pulse; and said low-level signal generating means generates the signal corresponding to the low level of the injection pulse by utilizing a constant-level voltage.

12. An input bias circuit according to claim 11, wherein said switching element includes a MOSFET having a gate electrode to which an output of the comparator is supplied, said MOSFET having a current path with first and second ends, said first end of the current path being connected to a point where a voltage sufficiently higher than the voltage of the input signal supplied to the CCD register is applied, and said second end of the current path being connected to that input gate electrode of the CCD register which is supplied with the input signal.

13. An input bias circuit according to claim 12, wherein:

said MOSFET is an N-channel MOSFET; and said comparator has an inverted input terminal for receiving the potential level obtained by the potential converter circuit, and a non-inverted input terminal for receiving the low-level signal generated by the low-level signal generating means.

14. An input bias circuit according to claim 12, wherein:

said MOSFET is a P-channel MOSFET; and said comparator has a non-inverted input terminal for receiving the potential level obtained by the potential converter circuit, and an inverted input terminal for receiving the low-level signal generated by the low-level signal generating means.

* * * * *

UNITED STATES PATENT AND TRADEMARK OFFICE
CERTIFICATE OF CORRECTION

PATENT NO. :  5,140,623
DATED      :  August 18, 1992
INVENTOR(S) : Shin-ichi Imai et al.

It is certified that error appears in the above-identified patent and that said Letters Patent is hereby corrected as shown below:

Claim 10, column 9, line 8,    change "$\phi$CD" to --CCD--.

Signed and Sealed this

Twenty-eighth Day of December, 1993

Attest:

BRUCE LEHMAN

Attesting Officer    Commissioner of Patents and Trademarks